US012635449B2

(12) United States Patent
Segawa

(10) Patent No.: US 12,635,449 B2
(45) Date of Patent: May 19, 2026

(54) HEAT TREATMENT APPARATUS

(71) Applicant: SCREEN Holdings Co., Ltd., Kyoto (JP)

(72) Inventor: Satoshi Segawa, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 922 days.

(21) Appl. No.: 17/785,423

(22) PCT Filed: Feb. 2, 2021

(86) PCT No.: PCT/JP2021/003626
§ 371 (c)(1),
(2) Date: Jun. 15, 2022

(87) PCT Pub. No.: WO2021/157544
PCT Pub. Date: Aug. 12, 2021

(65) Prior Publication Data
US 2023/0013900 A1     Jan. 19, 2023

(30) Foreign Application Priority Data

Feb. 3, 2020     (JP) ................................. 2020-016091

(51) Int. Cl.
*H01L 21/67*         (2006.01)
*H01L 21/603*        (2006.01)
(Continued)

(52) U.S. Cl.
CPC ...... *H10P 72/0436* (2026.01); *H10P 72/0452* (2026.01); *H10P 72/0604* (2026.01); *H10W 72/07232* (2026.01)

(58) Field of Classification Search
CPC ............. H01L 21/603; H01L 21/67017; H01L 21/67115; H01L 21/67161; H01L 21/67253; H01L 21/31; H01L 21/67
See application file for complete search history.

(56) References Cited

U.S. PATENT DOCUMENTS 5,441,076 A     8/1995   Moriya et al.
6,527,884 B1    3/2003   Takakuwa et al.
(Continued)

FOREIGN PATENT DOCUMENTS

CN         110211896 A     9/2019
JP         H06-291007 A    10/1994
(Continued)

OTHER PUBLICATIONS

Notice of Decision to Grant dated May 24, 2024 in corresponding Korean Patent Application No. 10-2022-7026138.
(Continued)

*Primary Examiner* — Elizabeth M Kerr
*Assistant Examiner* — Adam M Eckardt
(74) *Attorney, Agent, or Firm* — OSTROLENK FABER LLP

(57)         ABSTRACT

A chamber in which heating treatment is performed by irradiating a semiconductor wafer with light and a combustible gas supply source are connected in communication with each other by a combustible gas supply pipe. An electrical flow rate controller for regulating a supply flow rate of a combustible gas, and the like are interposed in the combustible gas supply pipe. Part of the combustible gas supply pipe which includes the electrical flow rate controller and the like that can be an ignition source is surrounded by an inner enclosure. Nitrogen which is a noncombustible gas is supplied to an inner space inside the inner enclosure. The noncombustible gas is supplied to the inner space, and a gas remaining in the inner space is discharged, whereby the concentration of oxygen in the inner space is decreased to below an explosion limit. This prevents fires and explosions of the combustible gas.

6 Claims, 2 Drawing Sheets

(51) Int. Cl.
    *H10P 72/00* (2026.01)
    *H10W 72/00* (2026.01)

(56) References Cited

U.S. PATENT DOCUMENTS

| | | | |
|---|---|---|---|
| 6,761,770 B2* | 7/2004 | Bartholomew | C23C 16/453 |
| | | | 118/712 |
| 2004/0168742 A1* | 9/2004 | Kim | H01L 21/67017 |
| | | | 141/98 |
| 2015/0330631 A1 | 11/2015 | Amikura et al. | |
| 2017/0062249 A1 | 3/2017 | Aoyama et al. | |
| 2018/0337103 A1 | 11/2018 | Omori et al. | |
| 2019/0267262 A1 | 8/2019 | Aoyama et al. | |
| 2021/0296141 A1* | 9/2021 | Omori | H01L 21/67098 |

FOREIGN PATENT DOCUMENTS

| | | | |
|---|---|---|---|
| JP | H07-283164 | A | 10/1995 |
| JP | 2002-343792 | A | 11/2002 |
| JP | 2008-300445 | A | 12/2008 |
| JP | 2009-539231 | A | 11/2009 |
| JP | 2017-045982 | A | 3/2017 |
| JP | 2018-195689 | A | 12/2018 |
| KR | 10-2001-0076212 | A | 8/2001 |
| KR | 10-0766303 | B1 | 10/2007 |
| KR | 10-2020-0031798 | A | 3/2020 |
| WO | WO 2004/042487 | A1 | 5/2004 |
| WO | WO 2007/091784 | A1 | 8/2007 |

OTHER PUBLICATIONS

International Search Report mailed Mar. 30, 2021 in corresponding PCT International Application No. PCT/JP2021/003626.

Written Opinion mailed Mar. 30, 2021 in corresponding PCT International Application No. PCT/JP2021/003626.

Notice of Decision to Grant with Search Report dated Jul. 1, 2025 in corresponding Chinese Patent Application No. 202180011495.6 with English language translation.

* cited by examiner

HEAT TREATMENT APPARATUS

CROSS-REFERENCE TO RELATED APPLICATIONS

The present application is a 35 U.S.C. §§ 371 national phase conversion of International Application No. PCT/JP2021/003626, filed Feb. 2, 2021, which claims priority to Japanese Patent Application No. 2020-016091, filed Feb. 3, 2020, the contents of both of which are incorporated herein by reference. The PCT International Application was published in the Japanese language.

TECHNICAL FIELD

The present invention relates to a heat treatment apparatus which irradiates a thin plate-like precision electronic substrate (hereinafter referred to simply as a "substrate") such as a semiconductor wafer with light to heat the substrate.

BACKGROUND ART

A heat treatment apparatus which irradiates a semiconductor wafer with light to heat the semiconductor wafer has been widely used as an apparatus for manufacturing a semiconductor device. For example, Patent Document 1 discloses a heat treatment apparatus which irradiates a semiconductor wafer with a high dielectric constant film (a high-k film) deposited thereon with a flash of light from flash lamps to momentarily heat a surface of the semiconductor wafer, thereby performing post-deposition heat treatment (post deposition anneal) of the high dielectric constant film.

In such a heat treatment apparatus, heat treatment is often performed using combustible gases such as hydrogen ($H_2$) and ammonia ($NH_3$), for example. In the heat treatment apparatus disclosed in Patent Document 1, nitriding of the high dielectric constant film is performed by the heating treatment of a semiconductor wafer in an ammonia atmosphere.

PRIOR ART DOCUMENTS

Patent Documents

Patent Document 1: Japanese Patent Application Laid-Open No. 2017-045982

SUMMARY

Problem to be Solved by the Invention

When combustible gases are used, there is a strong need for measures to prevent fires and explosions caused by the combustible gases. The control of the flow rate and pressure of a combustible gas to be used is often done by an electrical system. Because of the high risk of the electrical system becoming a source of ignition, measures using barrier relays of intrinsically safe explosion-proof construction are typically required. However, the barrier relays of intrinsically safe explosion-proof construction have a limited range of use because of their large structure and high costs in addition to their low controllable current capacity.

In view of the foregoing, it is therefore an object of the present invention to provide a heat treatment apparatus capable of preventing fires and explosions of a combustible gas with a simple configuration.

Means to Solve the Problem

To solve the aforementioned problem, a first aspect of the present invention is intended for a heat treatment apparatus for irradiating a substrate with light to heat the substrate, which comprises: a chamber for receiving a substrate therein; a lamp for irradiating the substrate received in the chamber with light; a first gas supply pipe for supplying a combustible gas from a first gas supply source to the chamber; an electrical flow rate regulator interposed in the first gas supply pipe and for regulating a supply flow rate of the combustible gas; a first enclosure for surrounding part of the first gas supply pipe which includes at least the flow rate regulator; a second enclosure for further surrounding the first enclosure; a second gas supply pipe for supplying a noncombustible gas from a second gas supply source to a first space inside the first enclosure; and a gas outlet provided in the first enclosure and for releasing a gas remaining in the first space to a second space formed between the first enclosure and the second enclosure.

A second aspect of the present invention is intended for the heat treatment apparatus of the first aspect, which further comprises an exhaust part for exhausting a gas remaining in the second space.

A third aspect of the present invention is intended for the heat treatment apparatus of the second aspect, which further comprises an intake port provided in the second enclosure and for bringing air into the second space.

A fourth aspect of the present invention is intended for the heat treatment apparatus of the first aspect, which further comprises a first differential pressure gauge for measuring a differential pressure between pressure in the first space and pressure in the second space.

A fifth aspect of the present invention is intended for the heat treatment apparatus of the fourth aspect, which further comprises a second differential pressure gauge for measuring a differential pressure between the pressure in the second space and atmospheric pressure.

A sixth aspect of the present invention is intended for the heat treatment apparatus of the fifth aspect, which further comprises a controller that stops supplying the combustible gas from the first gas supply source to the chamber when the pressure in the second space is not less than the pressure in the first space or when the pressure in the second space is not less than the atmospheric pressure.

Effects of the Invention

In the heat treatment apparatus according to the first to sixth aspects, part of the first gas supply pipe which includes at least the electrical flow rate regulator is surrounded by the first enclosure. The noncombustible gas is supplied to the first space inside the first enclosure, and the gas remaining in the first space is released. This decreases the concentration of oxygen in the first space to prevent fires and explosions of the combustible gas with a simple configuration. Also, the noncombustible gas is released to the second space inside the second enclosure, which is safe.

In particular, in the heat treatment apparatus according to the sixth aspect, the supply of the combustible gas from the first gas supply source to the chamber is stopped when the pressure in the second space is not less than the pressure in the first space or when the pressure in the second space is not less than the atmospheric pressure. This prevents fires and explosions of the combustible gas with reliability.

DESCRIPTION OF EMBODIMENT(S)

An embodiment according to the present invention will now be described in detail with reference to the drawings.

Figure 1:
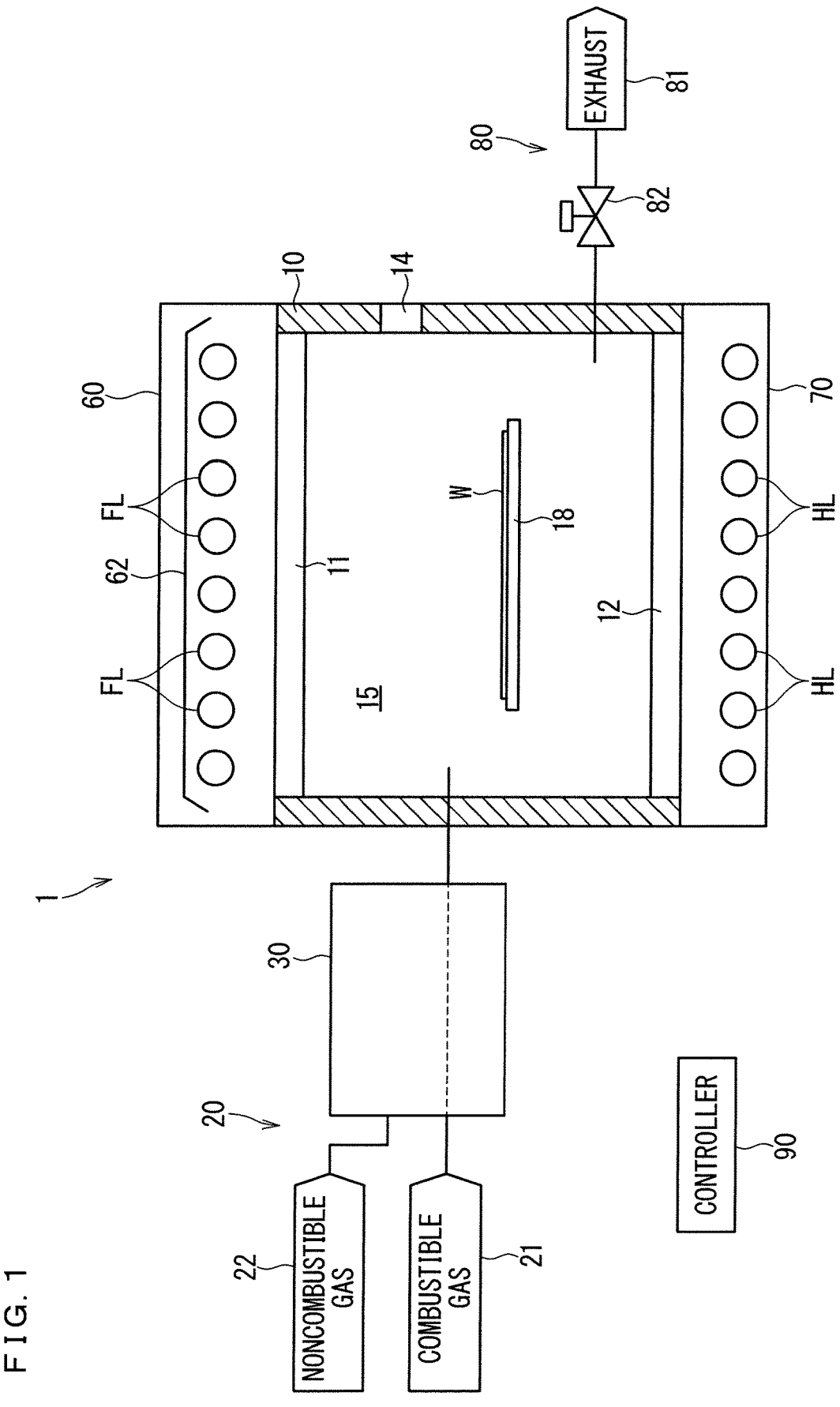
FIG. 1 is a view showing a configuration of principal parts of a heat treatment apparatus according to the present invention.

FIG. 1 is a view showing a configuration of principal parts of a heat treatment apparatus 1 according to the present invention. The heat treatment apparatus 1 of FIG. 1 is a flash lamp annealer for irradiating a disk-shaped semiconductor wafer W serving as a substrate with flashes of light to heat the semiconductor wafer W. The size of the semiconductor wafer W to be treated is not particularly limited. For example, the semiconductor wafer W to be treated has a diameter of 300 mm or 450 mm. It should be noted that the dimensions of components and the number of components are shown in exaggeration or in simplified form, as appropriate, in FIG. 1 and the subsequent figures for the sake of easier understanding.

The heat treatment apparatus 1 includes: a chamber 10 for receiving a semiconductor wafer W therein; a flash irradiation part 60 for irradiating the semiconductor wafer W in the chamber 10 with flashes of light; a halogen irradiation part 70 for irradiating the semiconductor wafer W with halogen light; a gas supply part 20 for supplying a treatment gas into the chamber 10; and an exhaust part 80 for exhausting a gas from the chamber 10. The heat treatment apparatus 1 further includes a controller 90 for controlling these parts to cause these parts to perform flash irradiation.

The chamber 10 receives therein the semiconductor wafer W to be treated, and heat treatment of the semiconductor wafer W is performed in the chamber 10. An upper chamber window 11 is mounted to block a top opening of the chamber 10, and a lower chamber window 12 is mounted to block a bottom opening of the chamber 10. A space surrounded by a side wall of the chamber 10, the upper chamber window 11, and the lower chamber window 12 is defined as a heat treatment space 15. The upper chamber window 11 forming the ceiling of the chamber 10 is a plate-like member made of quartz, and serves as a quartz window that transmits flashes of light emitted from the flash irradiation part 60 therethrough into the heat treatment space 15. The lower chamber window 12 forming the floor of the chamber 10 is also a plate-like member made of quartz, and serves as a quartz window that transmits light emitted from the halogen irradiation part 70 therethrough into the heat treatment space 15.

The side wall of the chamber 10 is provided with a transport opening 14 for the transport of a semiconductor wafer W therethrough into and out of the chamber 10. The transport opening 14 is openable and closable by a gate valve not shown. When the transport opening 14 is opened, a transport robot not shown is allowed to transport a semiconductor wafer W into and out of the chamber 10. When the transport opening 14 is closed, the heat treatment space 15 is an enclosed space so that the ventilation between the heat treatment space 15 and the outside is interrupted.

A susceptor 18 for holding the semiconductor wafer W is provided within the chamber 10. The susceptor 18 is a disk-shaped member made of quartz. The diameter of the susceptor 18 is slightly greater than that of the semiconductor wafer W. The susceptor 18 holds the semiconductor wafer W in a horizontal attitude (an attitude such that the normal to a main surface thereof coincides with a vertical direction) within the chamber 10.

The flash irradiation part 60 is provided over the chamber 10. The flash irradiation part 60 includes a light source including multiple flash lamps FL, and a reflector 62 provided so as to cover the light source from above. The flash irradiation part 60 directs flashes of light from the flash lamps FL through the upper chamber window 11 made of quartz onto the semiconductor wafer W held by the susceptor 18 within the chamber 10.

The flash lamps FL, each of which is a rod-shaped lamp having an elongated cylindrical shape, are arranged in a plane so that the longitudinal directions of the respective flash lamps FL are in parallel with each other along the main surface of the semiconductor wafer W held by the susceptor 18 (that is, in a horizontal direction). Thus, a plane defined by the arrangement of the flash lamps FL is also a horizontal plane.

Each of the flash lamps FL includes a cylindrical glass tube (discharge tube) containing xenon gas sealed therein and having positive and negative electrodes provided on opposite ends thereof and connected to a capacitor, and a trigger electrode attached to the outer peripheral surface of the glass tube. Because the xenon gas is electrically insulative, no current flows in the glass tube in a normal state even if electrical charge is stored in the capacitor. However, if a high voltage is applied to the trigger electrode to produce an electrical breakdown, electricity stored in the capacitor flows momentarily in the glass tube, and xenon atoms or molecules are excited at this time to cause light emission. Such a flash lamp FL has the property of being capable of emitting extremely intense light as compared with a light source that stays lit continuously such as a halogen lamp HL because the electrostatic energy previously stored in the capacitor is converted into an ultrashort light pulse ranging from 0.1 to 100 milliseconds. Thus, the flash lamps FL are pulsed light emitting lamps which emit light instantaneously for an extremely short time period of less than one second. The light emission time of the flash lamps FL is adjustable by the coil constant of a lamp light source which supplies power to the flash lamps FL.

The reflector 62 is provided over the plurality of flash lamps FL so as to cover all of the flash lamps FL. A fundamental function of the reflector 62 is to reflect flashes of light emitted from the plurality of flash lamps FL toward the heat treatment space 15. The reflector 62 is a plate made of an aluminum alloy. A surface of the reflector 62 (a surface which faces the flash lamps FL) is roughened by abrasive blasting.

The halogen irradiation part 70 is provided under the chamber 10. The halogen irradiation part 70 incorporates multiple halogen lamps HL. The halogen irradiation part 70 directs light from under the chamber 10 through the lower chamber window 12 toward the heat treatment space 15 to heat the semiconductor wafer W by means of the halogen lamps HL.

Each of the halogen lamps HL is a rod-shaped lamp having an elongated cylindrical shape. The halogen lamps HL are arranged in a plane so that the longitudinal directions thereof are in parallel with each other along the main surface of the semiconductor wafer W held by the susceptor 18. Thus, a plane defined by the arrangement of the halogen lamps HL is also a horizontal plane. The halogen lamps HL may be arranged in two tiers, i.e. upper and lower tiers, in a lattice pattern.

Each of the halogen lamps HL is a filament-type light source which passes current through a filament disposed in a glass tube to make the filament incandescent, thereby emitting light. A gas prepared by introducing a halogen element (iodine, bromine and the like) in trace amounts into an inert gas such as nitrogen, argon and the like is sealed in the glass tube. The introduction of the halogen element allows the temperature of the filament to be set at a high temperature while suppressing a break in the filament. Thus, the halogen lamps HL have the properties of having a longer life than typical incandescent lamps and being capable of continuously emitting intense light. That is, the halogen lamps HL are continuous lighting lamps that emit light continuously for not less than one second.

The exhaust part 80 includes an exhaust device 81 and an exhaust valve 82. By opening the exhaust valve 82, an atmosphere in the chamber 10 is exhausted. A vacuum pump or a utility exhaust system in a factory in which the heat treatment apparatus 1 is installed may be used as the exhaust device 81. When the vacuum pump is used as the exhaust device 81 to exhaust the atmosphere in the heat treatment space 15 that is an enclosed space without the supply of gas from the gas supply part 20, the atmosphere in the chamber 10 is reduced in pressure to a vacuum atmosphere. Even when the vacuum pump is not used as the exhaust device 81, the pressure of the atmosphere in the chamber 10 is reduced to a pressure lower than atmospheric pressure by exhausting the atmosphere without the supply of gas from the gas supply part 20.

Figure 2:
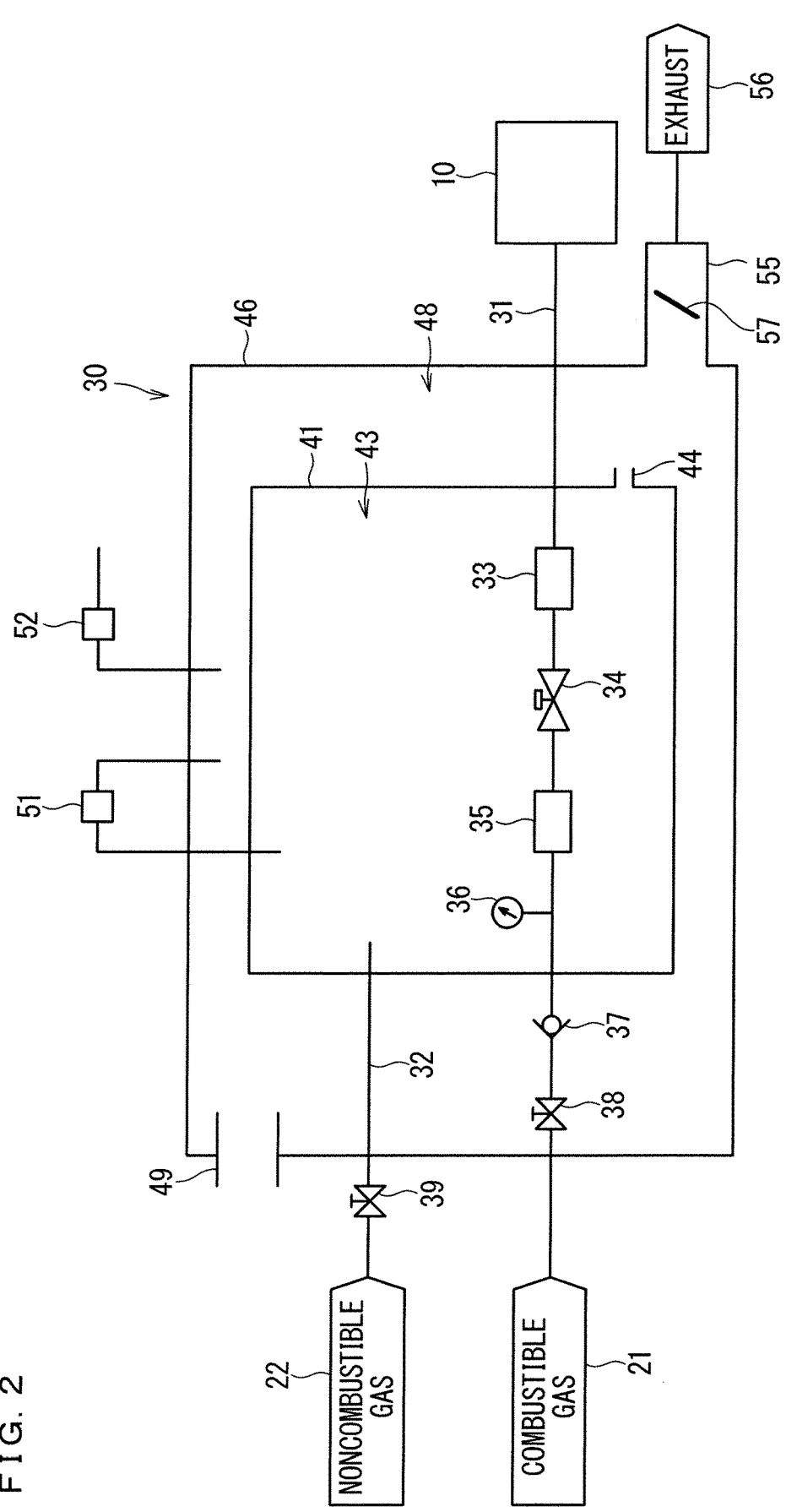
FIG. 2 is a diagram showing a configuration of an explosion-proof mechanism.

The gas supply part 20 includes a combustible gas supply source (a first gas supply source) 21, a noncombustible gas supply source (a second gas supply source) 22, and an explosion-proof mechanism 30. FIG. 2 is a diagram showing a configuration of the explosion-proof mechanism 30. The explosion-proof mechanism 30 includes an inner enclosure (a first enclosure) 41 and an outer enclosure (a second enclosure) 46.

The combustible gas supply source 21 and the chamber 10 are connected in communication with each other by a combustible gas supply pipe (a first gas supply pipe) 31. Specifically, the combustible gas supply pipe 31 has a distal end connected to the chamber 10, and a proximal end connected to the combustible gas supply source 21. A combustible gas delivered from the combustible gas supply source 21 is supplied to the chamber 10 by the combustible gas supply pipe 31. Examples of the combustible gas supplied from the combustible gas supply source 21 include ammonia ($NH_3$) and hydrogen ($H_2$) (although ammonia is used in the present embodiment).

An electrical flowmeter 33, an air valve 34, an electrical flow rate controller 35, an electrical pressure sensor 36, a check valve 37, and a hand valve 38 in order of proximity to the chamber 10 are interposed in the path of the combustible gas supply pipe 31. The electrical flowmeter 33 measures the flow rate of the combustible gas flowing through the combustible gas supply pipe 31. The air valve 34 opens and closes the flow path of the combustible gas supply pipe 31 under the control of the controller 90. The electrical flow rate controller 35 controls the flow rate of the combustible gas flowing through the combustible gas supply pipe 31 in accordance with instructions from the controller 90. In other words, the electrical flow rate controller 35 is a flow rate regulator for regulating the supply flow rate of the combustible gas. The electrical pressure sensor 36 measures the pressure in the combustible gas supply pipe 31. The check valve 37 is a valve for preventing backflow of the combustible gas in the combustible gas supply pipe 31. The hand valve 38 is a valve opened and closed manually. Each of these components is incorporated by a joint in a location of the combustible gas supply pipe 31 where each of the components is interposed. Of these components, the electrical flowmeter 33, the electrical flow rate controller 35, and the electrical pressure sensor 36 are electrically operated components that can become ignition sources in the event of a spark resulting from a short circuit or the like.

The inner enclosure 41 is provided so as to surround part of the combustible gas supply pipe 31 which includes at least the electrical flowmeter 33, the electrical flow rate controller 35, and the electrical pressure sensor 36 that are electrically operated. As shown in FIG. 2, the electrical flowmeter 33, the electrical flow rate controller 35, the electrical pressure sensor 36, and the air valve 34 are disposed in the inner enclosure 41 in the present embodiment. The combustible gas supply pipe 31 is provided so as to pass through the inner enclosure 41.

The inner enclosure 41 is further surrounded by the outer enclosure 46. The check valve 37 and the hand valve 38 are disposed between the inner enclosure 41 and the outer enclosure 46.

The noncombustible gas supply source 22 and the inner enclosure 41 are connected in communication with each other by a noncombustible gas supply pipe (a second gas supply pipe) 32. A valve 39 is interposed in the path of the noncombustible gas supply pipe 32. The valve 39 may be provided in an appropriate position in the noncombustible gas supply pipe 32. The valve 39 opens and closes the flow path of the noncombustible gas supply pipe 32 under the control of the controller 90. When the valve 39 is opened, a noncombustible gas is supplied from the noncombustible gas supply source 22 through the noncombustible gas supply pipe 32 to an inner space (a first space) 43 inside the inner enclosure 41. Examples of the noncombustible gas supplied from the noncombustible gas supply source 22 include nitrogen ($N_2$) and argon (Ar) (although nitrogen is used in the present embodiment).

The inner enclosure 41 is provided with a gas outlet 44. The gas outlet 44 provides communication between the inner space 43 inside the inner enclosure 41 and an exhaust space (a second space) 48 formed between the inner and outer enclosures 41 and 46. When the noncombustible gas is supplied from the noncombustible gas supply source 22 to the inner space 43 to increase the pressure in the inner space 43, the gas outlet 44 releases a gas remaining in the inner space 43 to the exhaust space 48.

The outer enclosure 46 is provided with an exhaust port 55. The exhaust port 55 is connected in communication with an exhaust device 56. The exhaust port 55 is provided with an exhaust damper 57. The exhaust damper 57 is set to an appropriate degree of opening under the control of the controller 90. The exhaust device 56 operates, with the exhaust damper 57 set to the appropriate degree of opening, whereby an atmosphere in the exhaust space 48 is exhausted from the exhaust port 55. The exhaust flow rate from the exhaust port 55 is regulated by the degree of opening of the exhaust damper 57. In other words, the exhaust port 55, the exhaust device 56, and the exhaust damper 57 constitute an exhaust part for exhausting a gas remaining in the exhaust space 48. The exhaust device 56 may be the same as the exhaust device 81 of the chamber 10.

The outer enclosure 46 is provided with an intake port 49. The intake port 49 is an opening for bringing air from an atmosphere of air outside the outer enclosure 46 into the exhaust space 48.

The explosion-proof mechanism 30 further includes a micro differential pressure gauge (a first differential pressure gauge) 51 and a micro differential pressure gauge (a second differential pressure gauge) 52. The micro differential pressure gauge 51 measures a differential pressure between the pressure in the inner space 43 and the pressure in the exhaust space 48. The micro differential pressure gauge 52, on the other hand, measures a differential pressure between the pressure in the exhaust space 48 and atmospheric pressure. The results of measurement made by the micro differential pressure gauges 51 and 52 are transmitted to the controller 90.

The controller 90 controls the aforementioned various operating mechanisms provided in the heat treatment apparatus 1. The controller 90 is similar in hardware configuration to a typical computer. Specifically, the controller 90 includes a CPU that is a circuit for performing various computation processes, a ROM or read-only memory for storing a basic program therein, a RAM or readable/writable memory for storing various pieces of information therein, a magnetic disk for storing control applications, data and the like thereon, and the like. The CPU in the controller 90 executes a predetermined processing program, whereby the processes in the heat treatment apparatus 1 proceed.

Next, a treatment operation in the heat treatment apparatus 1 will be described. Description will be given herein first briefly on the treatment of a semiconductor wafer W in the heat treatment apparatus 1, and then on explosion proofing during the supply of a combustible gas.

A semiconductor wafer W to be treated is transported through the transport opening 14 into the chamber 10, and is held by the susceptor 18. After the transport opening 14 is closed, ammonia which is a combustible gas is supplied from the gas supply part 20 into the chamber 10 to form an ammonia-containing atmosphere in the heat treatment space 15.

After the semiconductor wafer W is held by the susceptor 18 and the ammonia-containing atmosphere is formed in the heat treatment space 15, the halogen lamps HL in the halogen irradiation part 70 turn on to start preheating (or assist-heating) of the semiconductor wafer W. Light emitted from the halogen lamps HL is transmitted through the lower chamber window 12 and the susceptor 18 both made of quartz, and impinges upon the lower surface of the semiconductor wafer W. By receiving light irradiation from the halogen lamps HL, the semiconductor wafer W is preheated, so that the temperature of the semiconductor wafer W increases. After the temperature of the semiconductor wafer W increases to reach a predetermined preheating temperature, the temperature of the semiconductor wafer W is maintained at the preheating temperature for approximately several seconds.

The flash lamps FL in the flash irradiation part 60 irradiate the front surface of the semiconductor wafer W held by the susceptor 18 with a flash of light at the point in time when a predetermined time period has elapsed since the temperature of the semiconductor wafer W reached the preheating temperature. The flash of light emitted from the flash lamps FL is an intense flash of light obtained as a result of the conversion of the electrostatic energy previously stored in the capacitor into such an ultrashort light pulse. The flash of light is emitted for a period of time ranging from about 0.1 to about 100 milliseconds. The semiconductor wafer W is irradiated with such a flash of light which is extremely short in irradiation time and high in intensity, whereby the front surface temperature of the semiconductor wafer W momentarily increases to a treatment temperature, and thereafter decreases rapidly. The front surface of the semiconductor wafer W is momentarily heated to the treatment temperature in the ammonia-containing atmosphere, whereby a film (e.g., a high dielectric constant film) deposited on the front surface of the semiconductor wafer W is nitrided.

After a predetermined time period has elapsed since the completion of the flash heating treatment, the halogen lamps HL turn off. This causes the temperature of the semiconductor wafer W to decrease from the preheating temperature. The ammonia-containing atmosphere in the chamber 10 is discharged from the chamber 10 by the exhaust part 80. After the temperature of the semiconductor wafer W is decreased to a predetermined temperature or below, the semiconductor wafer W subjected to the heat treatment is transported outwardly through the transport opening 14. Thus, the heating treatment is completed.

During the supply of ammonia which is the combustible gas from the gas supply part 20 into the chamber 10, the hand valve 38 is opened, and the air valve 34 is opened under the control of the controller 90. This supplies the ammonia from the combustible gas supply source 21 through the combustible gas supply pipe 31 to the chamber 10. The supply flow rate of the ammonia supplied through the combustible gas supply pipe 31 to the chamber 10 is regulated by the electrical flow rate controller 35. The flow rate of the ammonia passing through the combustible gas supply pipe 31 is measured by the electrical flowmeter 33, and pressure in the combustible gas supply pipe 31 is measured by the electrical pressure sensor 36.

For a combustible gas such as ammonia to cause a fire or an explosion, there is a need for the three following factors: the presence of the combustible gas itself as a combustible material, an ignition source, and the presence of oxygen or the like as a combustion-supporting gas. There are piping joints in a location where the electrical flow rate controller 35 and the like are interposed, and there is a danger that the combustible gas leaks from the joints. The electrical flow rate controller 35 and the like operated by electricity can be an ignition source. In particular, if the electrical flowmeter 33, the electrical flow rate controller 35, and the electrical pressure sensor 36 are exposed to an oxygen-containing atmosphere, the three factors necessary for a fire or an explosion will be in place, so that there is a danger that a fire or an explosion occurs.

For this reason, the occurrence of a fire or an explosion is prevented in a manner to be described below in the present embodiment. First, part of the combustible gas supply pipe 31 which includes the electrical flowmeter 33, the electrical flow rate controller 35, and the electrical pressure sensor 36, which can be ignition sources, is surrounded by the inner enclosure 41. Then, nitrogen which is a noncombustible gas is supplied from the noncombustible gas supply source 22 through the noncombustible gas supply pipe 32 to the inner space 43 inside the inner enclosure 41. As the noncombustible gas is supplied to the inner space 43, the gas remaining in the inner space 43 is discharged from the gas outlet 44 to the exhaust space 48. As a result, the atmosphere in the inner space 43 is replaced with the noncombustible gas, so that the concentration of oxygen in the inner space 43 is decreased.

The differential pressure between the pressure in the inner space 43 and the pressure in the exhaust space 48 is measured by the micro differential pressure gauge 51. The oxygen concentration in the inner space 43 can be considered to have decreased to not greater than 3% if the pressure in the inner space 43 is higher than the pressure in the exhaust space 48, i.e. if the inner space 43 is positive in pressure relative to the exhaust space 48, in a situation where the noncombustible gas is supplied to the inner space 43 and the gas in the inner space 43 is discharged from the gas outlet 44. Even in the event of the occurrence of leakage of the combustible gas in the inner space 43, the oxygen concentration of not greater than 3% in the inner space 43 prevents a fire or an explosion of the combustible gas because the combustion-supporting gas is lacking among the three factors necessary for a fire or an explosion.

The nitrogen which is the noncombustible gas supplied to the inner space 43 is discharged from the gas outlet 44. If the nitrogen is directly released from the gas outlet 44 into an atmosphere of air, a high-concentration nitrogen atmosphere area (an area where oxygen deficiency occurs) is formed in the work space of operators in the heat treatment apparatus 1, which is dangerous. For this reason, in the present embodiment, the inner enclosure 41 is further surrounded by the outer enclosure 46, whereby the exhaust space 48 is formed between the inner and outer enclosures 41 and 46. The nitrogen discharged from the gas outlet 44 is released into the exhaust space 48. The nitrogen flowing into the exhaust space 48 is discharged from the exhaust port 55 by the exhaust device 56. There is no apprehension about a fire or an explosion in the exhaust space 48 because of the absence of any component that can be an ignition source in the exhaust space 48.

The differential pressure between the pressure in the exhaust space 48 and the atmospheric pressure is measured by the micro differential pressure gauge 52. The nitrogen in the exhaust space 48 is prevented from flowing backwardly through the intake port 49 to the atmosphere of air if the atmospheric pressure is higher than the pressure in the exhaust space 48, i.e. if the atmosphere of air is positive in pressure relative to the exhaust space 48. As a result, the high-concentration nitrogen atmosphere area is not formed in the work space of operators in the heat treatment apparatus 1, so that safety is ensured.

The results of measurement made by the micro differential pressure gauges 51 and 52 are monitored by the controller 90. Upon detecting that the pressure in the exhaust space 48 is not less than the pressure in the inner space 43 as a result of measurement made by the micro differential pressure gauge 51, the controller 90 closes the air valve 34 to stop supplying the combustible gas from the combustible gas supply source 21 to the chamber 10. This is because, if the pressure in the exhaust space 48 is not less than the pressure in the inner space 43, there is a likelihood that the oxygen concentration in the inner space 43 is higher than an explosion limit, so that the likelihood of a fire or an explosion of the combustible gas cannot completely be denied.

Upon detecting that the pressure in the exhaust space 48 is not less than the atmospheric pressure as a result of measurement made by the micro differential pressure gauge 52, the controller 90 closes the air valve 34 to stop supplying the combustible gas from the combustible gas supply source 21 to the chamber 10. At this time, the controller 90 also closes the valve 39 to stop supplying the nitrogen to the inner space 43. This is because, if the pressure in the exhaust space 48 is not less than the atmospheric pressure, there is apprehension that the nitrogen in the exhaust space 48 flows backwardly through the intake port 49 to the atmosphere of air, so that there is apprehension that the high-concentration nitrogen atmosphere area is formed in the work space of operators in the heat treatment apparatus 1.

In the present embodiment, part of the combustible gas supply pipe 31 which includes the electrical flowmeter 33, the electrical flow rate controller 35, and the electrical pressure sensor 36, which can be ignition sources, is surrounded by the inner enclosure 41. Then, the nitrogen which is the noncombustible gas is supplied to the inner space 43 inside the inner enclosure 41. The noncombustible gas is supplied to the inner space 43, and the gas remaining in the inner space 43 is discharged from the gas outlet 44, whereby the oxygen concentration in the inner space 43 is decreased to below the explosion limit. As a result, fires and explosions of the combustible gas are prevented even if the combustible gas leaks from a joint or the like of the combustible gas supply pipe 31. In other words, fires and explosions of the combustible gas are prevented with a simple configuration in which the noncombustible gas is supplied to the enclosure.

The inner enclosure 41 is further surrounded by the outer enclosure 46, and the noncombustible gas released from the inner space 43 to the exhaust space 48 is discharged from the exhaust port 55. This prevents the noncombustible gas from being released into the atmosphere of air to thereby ensure the safety of the work space of operators in the heat treatment apparatus 1.

The differential pressure between the pressure in the inner space 43 and the pressure in the exhaust space 48 is measured by the micro differential pressure gauge 51, and the differential pressure between the pressure in the exhaust space 48 and the atmospheric pressure is measured by the micro differential pressure gauge 52. The results of measurement made by the micro differential pressure gauges 51 and 52 are monitored by the controller 90. The supply of the combustible gas from the combustible gas supply source 21 to the chamber 10 is stopped when the pressure in the exhaust space 48 is not less than the pressure in the inner space 43 or when the pressure in the exhaust space 48 is not less than the atmospheric pressure. This prevents the fires and explosions of the combustible gas with reliability.

While the embodiment according to the present invention has been described hereinabove, various modifications of the present invention in addition to those described above may be made without departing from the scope and spirit of the invention. For example, the electrical flowmeter 33, the electrical flow rate controller 35, and the electrical pressure sensor 36 are the components that can be ignition sources in the aforementioned embodiment. The present invention, however, is not limited to this. Other components that can be ignition sources may be provided in the combustible gas supply pipe 31. In this case, all of the components that can be ignition sources are surrounded by the inner enclosure 41.

In the aforementioned embodiment, the filament-type halogen lamps HL are used as continuous lighting lamps that emit light continuously for not less than one second to preheat the semiconductor wafer W. The present invention, however, is not limited to this. In place of the halogen lamps HL, discharge type arc lamps (e.g., xenon arc lamps) may be used as the continuous lighting lamps to perform the preheating.

Moreover, a substrate to be treated by the heat treatment apparatus 1 is not limited to a semiconductor wafer, but may be a glass substrate for use in a flat panel display for a liquid crystal display apparatus and the like, and a substrate for a solar cell.

Also, the heating treatment is performed by irradiating the semiconductor wafer W with a flash of light in the chamber 10 in the aforementioned embodiment. The present invention, however, is not limited to this. The heating treatment may be performed by irradiating the semiconductor wafer W received in the chamber 10 with light from only the halogen lamps HL. Furthermore, the treatment of the semiconductor wafer W in the chamber 10 is not limited to the heat treatment by means of the light irradiation, but is required only to be a substrate treatment using combustible gases.

INDUSTRIAL APPLICABILITY

The technique according to the present invention is suitable for a substrate treatment technique that uses a combustible gas such as ammonia to perform a predetermined treatment on a substrate.

EXPLANATION OF REFERENCE SIGNS

1 Heat treatment apparatus
10 Chamber
20 Gas supply part
21 Combustible gas supply source
22 Noncombustible gas supply source
30 Explosion-proof mechanism
31 Combustible gas supply pipe
32 Noncombustible gas supply pipe
33 Electrical flowmeter
35 Electrical flow rate controller
36 Electrical pressure sensor
41 Inner enclosure
43 Inner space
46 Outer enclosure
48 Exhaust space
49 Intake port
51, 52 Micro differential pressure gauges
55 Exhaust port
56 Exhaust device
57 Exhaust damper
60 Flash irradiation part
70 Halogen irradiation part
90 Controller
FL Flash lamps
HL Halogen lamps

The invention claimed is:

1. A heat treatment apparatus for irradiating a substrate with light to heat the substrate, comprising:
   a chamber for receiving a substrate therein;
   a lamp for irradiating said substrate received in said chamber with light;
   a first gas supply pipe for supplying a combustible gas from a first gas supply source to said chamber;
   an electrical flow rate regulator interposed in said first gas supply pipe and for regulating a supply flow rate of said combustible gas;
   a first enclosure for surrounding part of said first gas supply pipe which includes at least said flow rate regulator;
   a second enclosure for further surrounding said first enclosure;
   a second gas supply pipe for supplying a noncombustible gas from a second gas supply source to a first space inside said first enclosure; and
   a gas outlet provided in said first enclosure and for releasing a gas remaining in said first space to a second space formed between said first enclosure and said second enclosure.

2. The heat treatment apparatus according to claim 1, further comprising an exhaust part for exhausting a gas remaining in said second space.

3. The heat treatment apparatus according to claim 2, further comprising an intake port provided in said second enclosure and for bringing air into said second space.

4. The heat treatment apparatus according to claim 1, further comprising
   a first differential pressure gauge for measuring a differential pressure between pressure in said first space and pressure in said second space.

5. The heat treatment apparatus according to claim 4, further comprising a second differential pressure gauge for measuring a differential pressure between the pressure in said second space and atmospheric pressure.

6. The heat treatment apparatus according to claim 5, further comprising a controller that stops supplying said combustible gas from said first gas supply source to said chamber when the pressure in said second space is not less than the pressure in said first space or when the pressure in said second space is not less than the atmospheric pressure.

* * * * *